US011171095B1

(12) United States Patent
Jain et al.

(10) Patent No.: US 11,171,095 B1
(45) Date of Patent: Nov. 9, 2021

(54) ACTIVE ATTACK PREVENTION FOR SECURE INTEGRATED CIRCUITS USING LATCHUP SENSITIVE DIODE CIRCUIT

(71) Applicant: GLOBALFOUNDRIES U.S. INC., Santa Clara, CA (US)

(72) Inventors: Vibhor Jain, Williston, VT (US); Ajay Raman, Essex Junction, VT (US); Sebastian T. Ventrone, South Burlington, VT (US); John J. Ellis-Monaghan, Grand Isle, VT (US); Siva P. Adusumilli, Burlington, VT (US); Yves T. Ngu, Williston, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/855,185

(22) Filed: Apr. 22, 2020

(51) Int. Cl.
*H01L 23/00* (2006.01)
(52) U.S. Cl.
CPC .......... *H01L 23/576* (2013.01); *H01L 23/573* (2013.01)
(58) Field of Classification Search
CPC .................................................. H01L 23/576
USPC ....................................................... 257/678
See application file for complete search history.

(56) References Cited

U.S. PATENT DOCUMENTS

| | | | |
|---|---|---|---|
| 7,295,455 B2 | 11/2007 | Okuda | |
| 8,198,641 B2 | 1/2012 | Zachariasse | |
| 8,110,894 B2 | 2/2012 | Savry et al. | |
| 8,742,830 B2 | 6/2014 | Luo et al. | |
| 8,809,858 B2 | 8/2014 | Lisart et al. | |
| 8,946,859 B2 | 2/2015 | Lisart et al. | |
| 9,117,833 B2 | 8/2015 | Mougin et al. | |
| 9,306,573 B2 | 4/2016 | McCollum | |
| 9,741,670 B2 | 8/2017 | Charbonnier et al. | |
| 9,953,727 B1 | 4/2018 | Fifield et al. | |
| 9,965,652 B2 | 5/2018 | Joharapurkar et al. | |
| 2014/0281810 A1* | 9/2014 | Gifford | G11C 29/52 714/764 |
| 2018/0075921 A1 | 3/2018 | Fifield et al. | |
| 2020/0303325 A1* | 9/2020 | Lewis | G06F 21/75 |

OTHER PUBLICATIONS

Specification and Figures for related U.S. Appl. No. 16/568,394, filed Sep. 12, 2019.

* cited by examiner

*Primary Examiner* — Ajay Arora
(74) *Attorney, Agent, or Firm* — Anthony Canale; Andrew M. Calderon; Roberts Calderon Safran & Cole, P.C.

(57) ABSTRACT

The present disclosure relates to an active x-ray attack prevention structure for secure integrated circuits. In particular, the present disclosure relates to a structure including a functional circuit, and at least one latchup sensitive diode circuit configured to induce a latchup condition in the functional circuit, placed in proximity of the functional circuit.

17 Claims, 9 Drawing Sheets

US 11,171,095 B1

ACTIVE ATTACK PREVENTION FOR SECURE INTEGRATED CIRCUITS USING LATCHUP SENSITIVE DIODE CIRCUIT

FIELD OF THE INVENTION

The present disclosure relates to integrated circuits, and more particularly, to an active x-ray attack prevention device for securing integrated circuits and methods of operation.

BACKGROUND

When using active x-ray spectrum analysis, a party can observe an integrated circuit under power and a voltage contrast and determine a functional state of the design. Further, it is possible to unlock a private key of devices once the decrypting step has been passed and the register is first used. A known technique to prevent such unlocking can encompass package shielding, but this is still prone to tampering. Accordingly, known techniques have not been able to prevent uncovering of key technology and intellectual property in an integrated circuit.

SUMMARY

In an aspect of the disclosure, a structure includes a functional circuit, and at least one latchup sensitive diode circuit configured to induce a latchup condition in the functional circuit, placed in proximity of the functional circuit.

In another aspect of the disclosure, a structure includes a plurality of functional circuits cascaded across a chip, and a plurality of latchup sensitive diode circuits which comprise a P-N diode circuit to induce a cascading latchup condition and is cascaded in a predetermined proximity of the functional circuits across the chip.

In another aspect of the disclosure, a method includes inducing a latchup condition which turns off a power supply to a functional circuit in response to a current in the functional circuit being above a predetermined threshold.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1A:
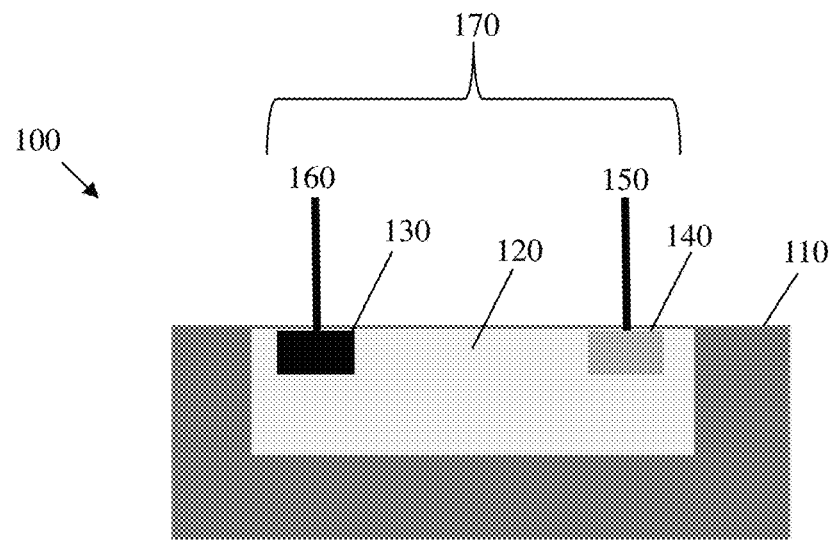
FIGS. 1A and 1B show schematic diagrams of latchup sensitive diode circuits in accordance with aspects of the present disclosure.

The present disclosure relates to integrated circuits, and more particularly, to an active x-ray attack prevention device for securing integrated circuits and methods of operation. More specifically, the present disclosure provides an in-built laser interrogation protection circuit component which includes circuits susceptible to a latchup placed in close proximity to functional circuits. By implementing the devices disclosed herein, circuits can latchup when induced by an x-ray illumination from a scanning electron microscope (SEM) or a backside attack. Accordingly and advantageously, by implementing the devices disclosed herein, the devices can prevent an active x-ray attack from determining a functional state of a circuit design and prevent the theft of key technology and intellectual property.

In known circuits, an attack and/or analysis can occur on a circuit from scanning a backside of a chip across a die. The attack and/or analysis can capture the function of the device which can then be re-constructed. For example, the analysis can be done through active and passive optical probing using photo emission (PE), electro-optical frequency modulation, or laser voltage techniques. To avoid the attack and/or analysis on a circuit, a charge trap logic structure can be used. However, in this type of circuit, the attack and/or analysis can occur after the charge trap device has been bypassed. Further, package shielding can prevent the attack and/or analysis on a circuit; however, the package shielding is susceptible to tampering. In contrast, the present disclosure provides an in-built laser interrogation protection circuit which can latchup from illumination from the SEM or backside attack.

In particular, complementary metal-oxide-semiconductor (CMOS) circuits are prone to latchup. In known CMOS circuits, special layouts and ground rules are used to avoid a latchup condition. In the present disclosure, though, a latchup condition is deliberately designed into the chip which is initiated by generating a large number of carriers in close proximity to a circuit. For example, the latchup condition can occur by creating lots of charges due to light irradiation from a backside attack using a scanning electron microscope (SEM). Therefore, structures sensitive to the latchup condition can be placed in close proximity or connected to the functional circuits to prevent an attack.

In other circuits, photodiodes are used across a chip to detect a backside attack. In particular, a voltage sensing circuit is used to detect a change in resistance when a photodiode is "ON" to generate a tamper signal. Multiple other known circuits utilize photodiodes, which directly generate a tamper signal under illumination. In contrast, in the present disclosure, photodiodes are used across a chip to prevent the backside attack (instead of simply detecting the backside attack) by placing the photodiodes in close proximity to the functional chips. In particular, in the present disclosure, under illumination, the photodiodes will result in a latchup condition of all of the functional chips.

FIG. 1A shows a P-N diode circuit 100. The P-N diode circuit 100 is a silicon P-N diode which acts as a photodetector for a scanning electron microscope (SEM) illumination using in a backside integrated circuit (IC) attack. In other words, the P-N diode circuit 100 can generate a lot of charge carriers under illumination. Therefore, the P-N diode circuit 100 is a latchup sensitive diode circuit which will cause latchup of other devices.

In FIG. 1A, a P-N diode circuit 100 includes a substrate 110 comprising an N-well 120. The N-well 120 can be formed by conventional doping or ion-implantation processes known in the art and described below. The substrate 110 can be semiconductor on insulator (SOI) or bulk technology. In SOI technology, an insulator layer is provided on top of a semiconductor layer. The insulator layer comprises any suitable material, including silicon oxide, sapphire, or other suitable insulating materials, and/or combinations thereof. An exemplary insulator layer may be a buried oxide layer (BOX). The insulator is formed by any suitable process, such as separation by implantation of oxygen (SIMOX), oxidation, deposition, and/or other suitable process. Another semiconductor layer is provided on top of the insulator layer to form a silicon-on-insulator (SOI) substrate, which can be fabricated using wafer bonding, and/or other suitable methods.

In embodiments, an N+ region 130 and a P+ region 140 are formed within the N-well 120. Further, a power supply 160 (e.g., the power supply 160 being at a VDD level) is connected to the N+ region 130 and a ground 150 is connected to the P+ region 140. Further, the N-well 120, the N+ region 130, and the P+ region 140 can be represented by a diode 170 (i.e., P-N diode 170, as shown in FIG. 1C).

The N-well 120, the N+ region 130, and the P+ region 140 can be formed by conventional ion implantation processes known to those of skill in the art. For example, the N-well 120 may be formed by introducing a dopant by, for example, ion implantation that includes a concentration of a dopant in the substrate 110. The different regions 130, 140 may be formed by introducing a concentration of a different dopant or opposite conductivity type in the substrate 110. In embodiments, respective patterned implantation masks may be used to define selected areas exposed for the implantations. The implantation mask used to select the exposed area for forming the well is stripped after implantation, and before the implantation mask used to form the well. Similarly, the implantation mask used to select the exposed area for forming the well is stripped after the implantation is performed. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block mask areas against receiving a dose of the implanted ions. The N-well 120 is doped with n-type dopants, e.g., Arsenic (As), Phosphorus (P), and Sb, among other suitable examples. The N+ region 130 is doped with a higher concentration of n-type dopants than the N-well 120. The P+ region is doped with p-type dopants, e.g., Boron (B).

Figure 1B:
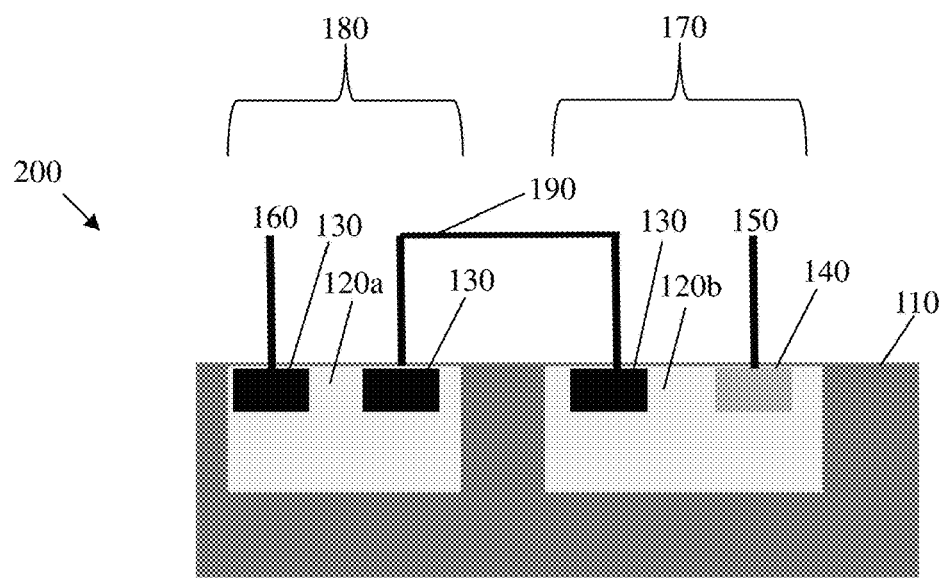

FIG. 1B shows a P-N diode circuit 200, which is similar to the P-N diode circuit 100 of FIG. 1A. In FIG. 1B, two separate N-wells 120a, 120b each contain at least one N+ region 130. The first N-well 120a contains two N+ regions 130 and the second N-well 120b contains an N+ region 130 and a P+ region 140. As shown in FIG. 1B, the additional N+ regions 130 in the P-N diode circuit 200 are electrically connected together through a connection 190.

Figure 1C:
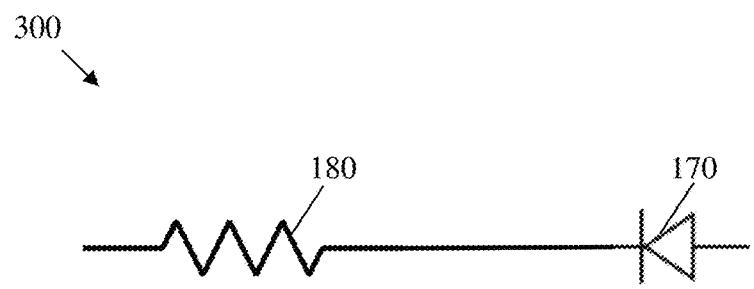
FIG. 1C shows a representative diagram of the latchup sensitive diode circuits in FIGS. 1A and 1B, in accordance with aspects of the present disclosure.

In FIG. 1B, the N-well 120a and the N+ regions 130 represent a resistor 180 (as shown in FIG. 1C). The N-well 120b with the N+ region 130 and the P+ region represent a diode 170 (similar to the P-N diode circuit 100 of FIG. 1A and as shown in FIG. 1C). Further, similar to FIG. 1A, the P-N diode circuit 200 can act as a photodetector for a SEM illumination used in a backside IC attack and can generate a lot of charge carriers under illumination. Therefore, the P-N diode circuit 200 in FIG. 1B is also a latchup sensitive diode circuit.

FIG. 1C shows a representative circuit diagram of the latchup sensitive diode circuits in FIGS. 1A and 1B. As detailed above, the P-N diode circuit 200 in FIG. 1B can be represented by a circuit 300 which includes the diode 170 (i.e., P-N diode 170) connected to the resistor 180. Further, the P-N diode circuit 100 in FIG. 1A can be represented by the diode 170 (i.e., P-N diode 170).

Figure 2:
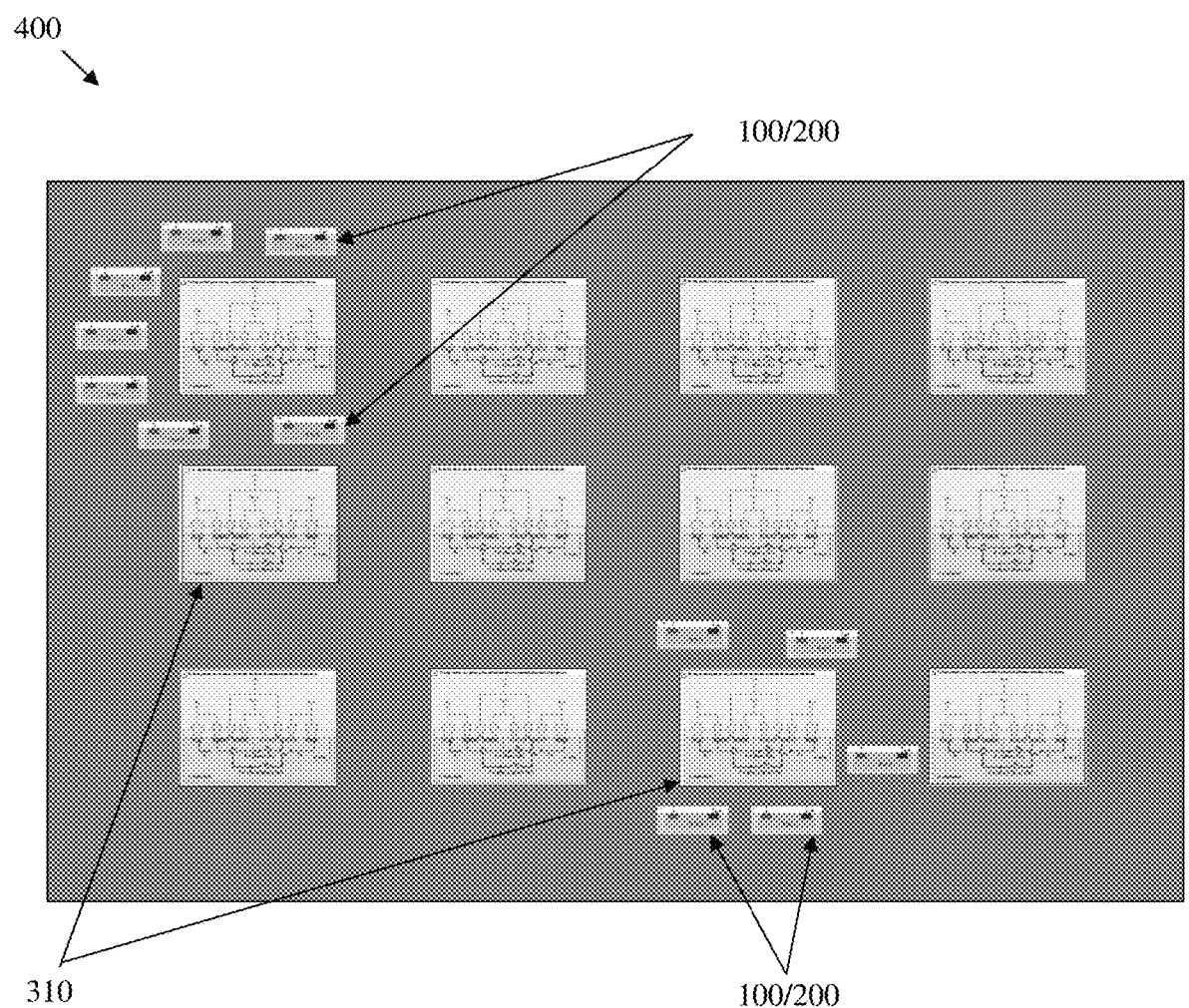
FIG. 2 shows a schematic diagram of functional circuits with the latchup sensitive diode circuits in FIGS. 1A and 1B, in accordance with aspects of the present disclosure.

FIG. 2 shows a schematic diagram of functional circuits with the latchup sensitive diode circuits in FIGS. 1A and 1B. In FIG. 2, the circuit 400 includes the P-N diode circuit 100/200 (i.e., a latchup sensitive diode circuit of FIGS. 1A and 1B) in close proximity to functional circuits 310. The functional circuits 310 can be any integrated circuit which is prone to a latchup condition (e.g., a memory circuit). In operation, when the P-N diode circuits 100/200 (i.e., latchup sensitive diode circuit) are under backside illumination, the P-N diode circuit 100/200 will generate extra local charges which will force the functional circuit 310 into the latchup condition. When the functional circuit 310 is forced into the latchup condition, the state of the functional circuit 310 will be locked up or the power may be hogged (i.e., the functional circuit 310 may be in an overloaded power condition), which results in local circuit damage to the functional circuit 310 rendering the chip useless.

Figure 3A:
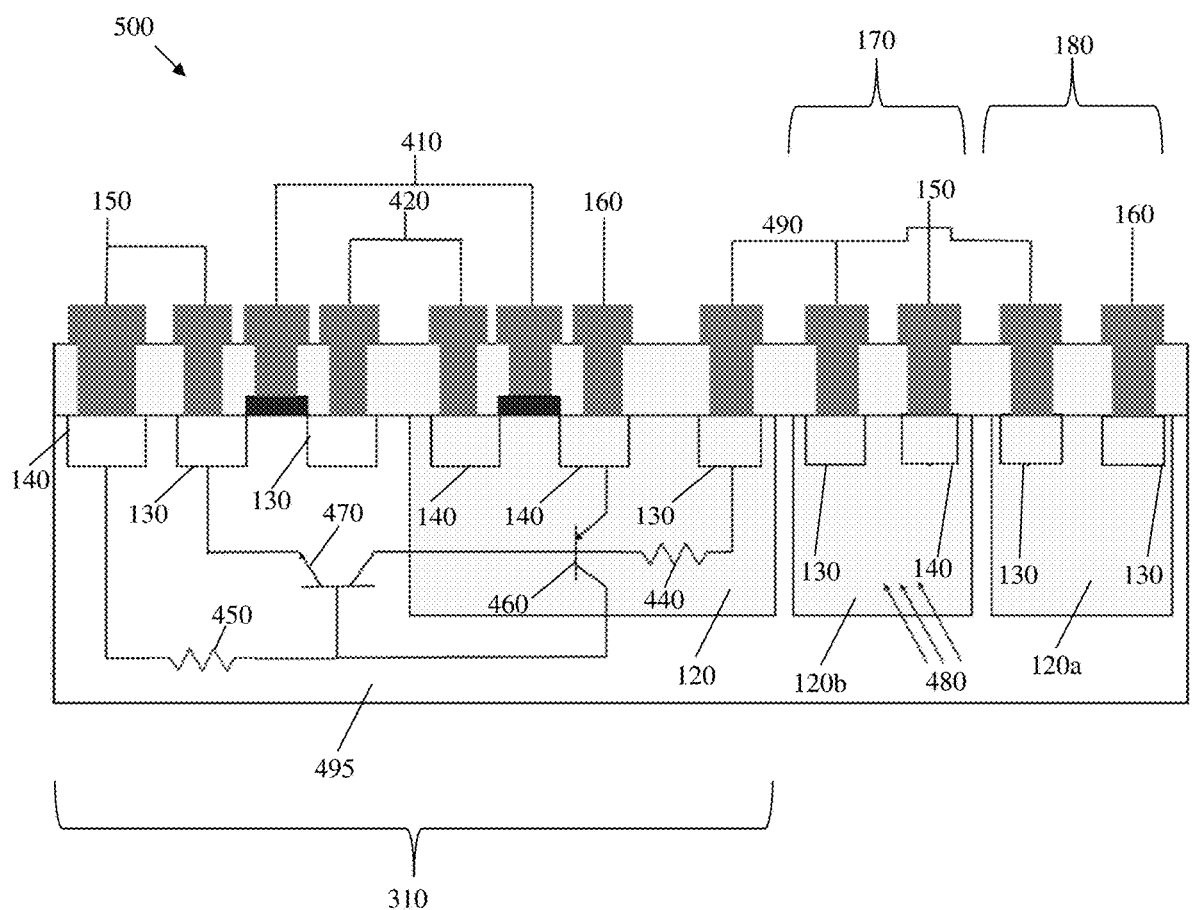
FIG. 3A shows a device diagram of a functional circuit connected to a latchup sensitive diode circuit in accordance with aspects of the present disclosure.

FIG. 3A shows a device diagram of a functional circuit connected to a latchup sensitive diode circuit in accordance with aspects of the present disclosure. In FIG. 3A, the device 500 connects a functional circuit 310 (e.g., CMOS inverter) to a latchup sensitive diode circuit (e.g., the diode 170 and the resistor 180). In particular, the device 500 includes an input voltage 410 (i.e., Vin), an output voltage 420 (i.e., Vout), a resistor 440 of the N-well 120 (i.e., Rn-well), a resistor 450 of a p-substrate 495 (i.e., Rsub), the bipolar junction transistors 460, 470, the connection 490, and the p-substrate 495.

Figure 3B:
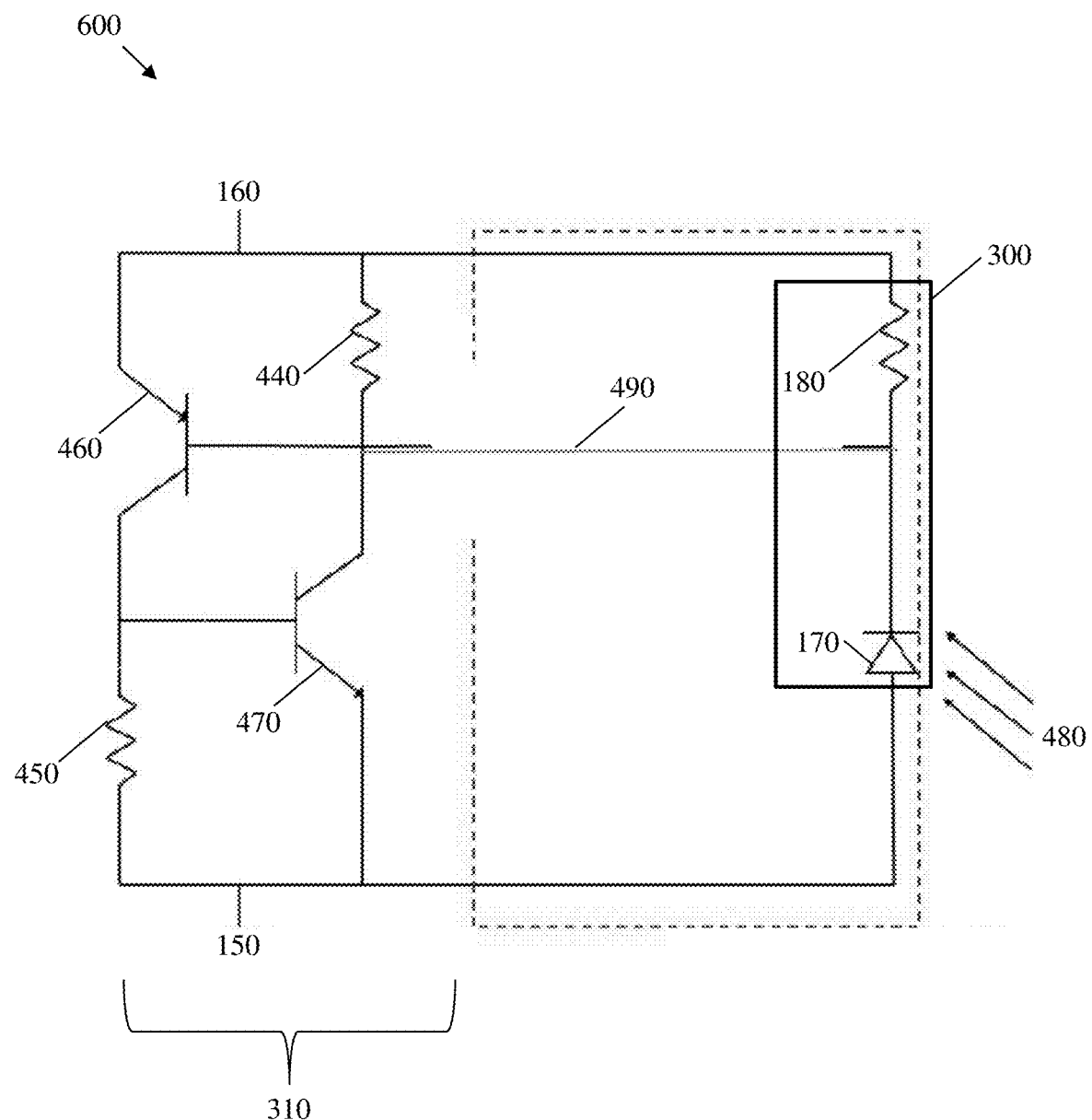
FIG. 3B shows a circuit diagram of the functional circuit connected to the latchup sensitive diode circuit in FIG. 3A, in accordance with aspects of the present disclosure.

The device 500 of FIG. 3A also includes N-wells 120, 120a, 120b, N+ regions 130, P+ regions 140, the ground 150, the power supply 160 (e.g., VDD). In FIG. 3A, the diode 170 includes the N+ region 130 and the P+ region 140 (similar to FIGS. 1A and 1B) and the resistor 180 includes two N+ regions 130 (similar to FIG. 1B). The resistor 440 of the N-well 120 is connected between the N+ region 130 and the bipolar junction transistor 460. The bipolar junction transistor 460 has an emitter connected to the P+ region 140, a collector connected to the resistor 450, and a base connected to the bipolar junction transistor 470. The bipolar junction transistor 470 has an emitter connected to the N+ region 130, a collector connected to the bipolar junction transistor 460, and a base connected to the resistor 450. The resistor 450 is connected to the P+ region 140 and the bipolar junction transistor 470. The functional circuit 310 (e.g., CMOS inverter) comprises the resistors 440, 450 and the bipolar junction transistors 460, 470. As shown in FIG. 3B, the connection 490 connects the functional circuit 310

(e.g., CMOS inverter) to the latchup sensitive diode circuit (e.g., the circuit 300 which includes the diode 170 and the resistor 180). Therefore, an x-ray back-side illumination 480 of the circuit 300 will force the functional circuit 310 to a latchup condition.

FIG. 3B shows a circuit diagram of the functional circuit connected to the latchup sensitive diode circuit. In FIG. 3B, the circuit 600 connects a functional circuit 310 (e.g., CMOS inverter) to the circuit 300 which includes the diode 170 and the resistor 180. In particular, the circuit 600 includes the diode 170 which is connected between the resistor 180 and the parasitic bipolar junction transistor 470 (i.e., a npn transistor).

Still referring to FIG. 3B, the resistor 440 is connected between the power supply 160 (e.g., VDD) and the parasitic bipolar junction transistor 470. The bipolar junction transistor 460 (i.e., a pnp transistor) has an emitter connected to the power supply 160 (e.g., VDD), a collector connected to the resistor 450, and a base connected to the bipolar junction transistor 470. The bipolar junction transistor 470 has an emitter connected to the ground 150, a collector connected to the bipolar junction transistor 460, and a base connected to the resistor 450. The resistor 450 is connected between the ground 150 and the bipolar junction transistor 470.

The functional circuit 310 (e.g., CMOS inverter) comprises the resistors 440, 450 and the bipolar junction transistors 460, 470. The functional circuit 310 is connected to the circuit 300 through a connection 490 (also shown in FIG. 3A). Further, an x-ray back-side illumination 480 of the circuit 300 will force the functional circuit 310 to a latchup condition.

Figure 4A:
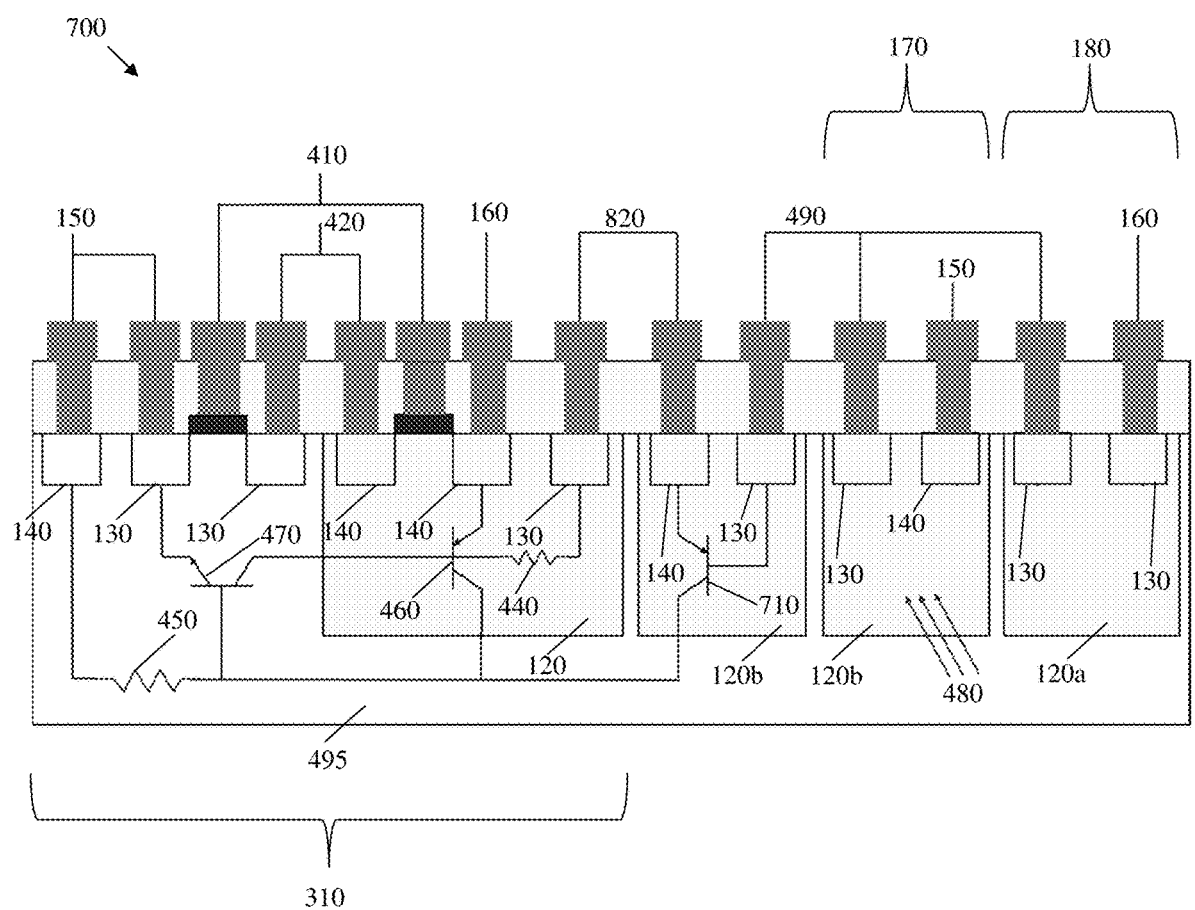
FIG. 4A shows a device diagram of a functional circuit connected to another latchup sensitive diode circuit in accordance with aspects of the present disclosure.

FIG. 4A shows a device diagram of a functional circuit connected to a latchup sensitive diode circuit. In FIG. 4A, the device 700 connects a functional circuit 310 (e.g., CMOS inverter) to a latchup sensitive diode circuit (e.g., the diode 170 and the resistor 180). In particular, the device 700 includes an input voltage 410 (i.e., Vin), an output voltage 420 (i.e., Vout), a resistor 440 of the N-well 120 (i.e., Rn-well), a resistor 450 of a p-substrate 495 (i.e., Rsub), bipolar junction transistors 460, 470, a connection 490, and the p-substrate 495.

Figure 4B:
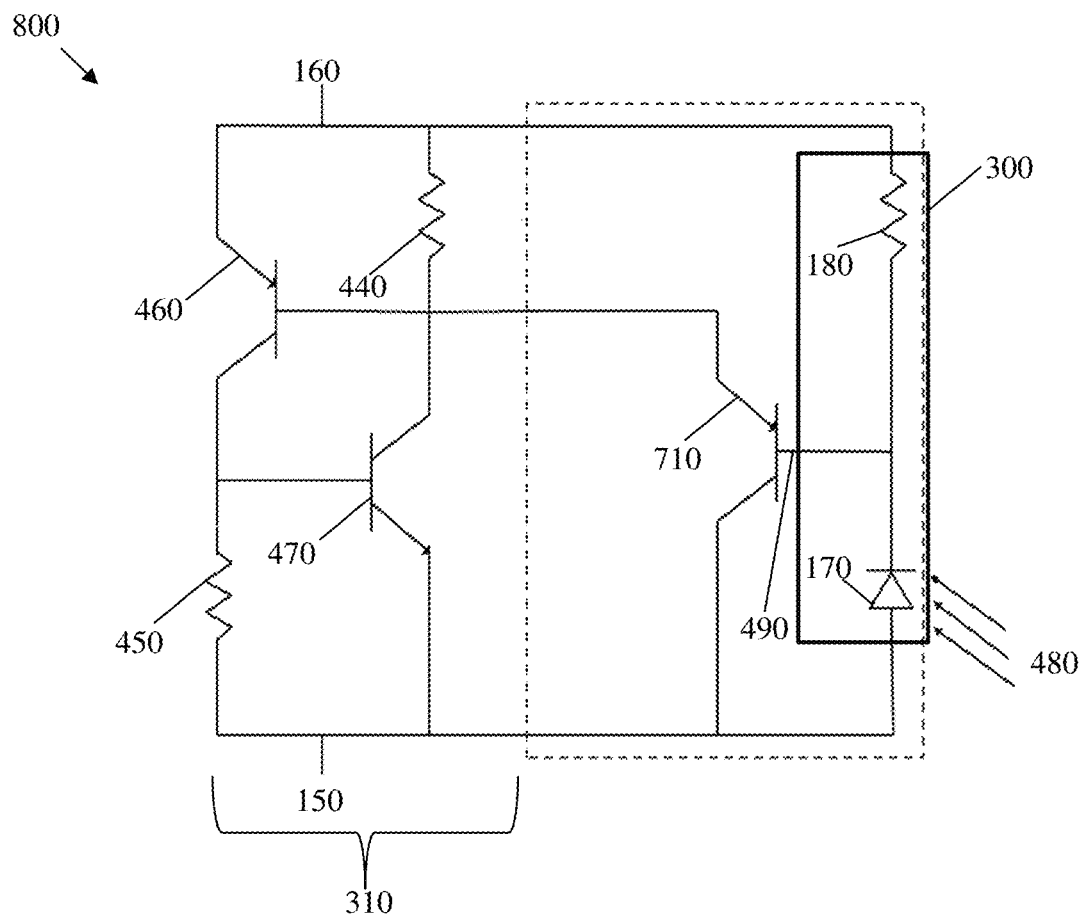
FIG. 4B shows a circuit diagram of the functional circuit connected to the another latchup sensitive diode circuit in FIG. 4A, in accordance with aspects of the present disclosure.

The device 700 of FIG. 4A also includes N-wells 120, 120a, 120b, N+ regions 130, P+ regions 140, the ground 150, the power supply 160 (e.g., VDD), the diode 170, and the resistor 180. In FIG. 4A, the diode 170 includes the N+ region 130 and the P+ region 140 and the resistor 180 includes two N+ regions 130. The resistor 440 of the N-well 120 is connected between the N+ region 130 and the bipolar junction transistor 460. The bipolar junction transistor 460 has an emitter connected to the P+ region 140, a collector connected to the resistor 450, and a base connected to the bipolar junction transistor 470. The bipolar junction transistor 470 has an emitter connected to the N+ region 130, a collector connected to the bipolar junction transistor 460, and a base connected to the resistor 450. The resistor 450 is connected to the P+ region 140 and the bipolar junction transistor 470. The parasitic bipolar PNP transistor 710 has an emitter connected to the P+ region 140, a collector connected to the resistor 450, and a base connected to the N+ region 130. The functional circuit 310 (e.g., CMOS inverter) comprises the resistors 440, 450 and the bipolar junction transistors 460, 470. As shown in FIG. 4B, a connection 820 connects the functional circuit 310 (e.g., CMOS inverter) to the latchup sensitive diode circuit (e.g., the circuit 300 which includes the diode 170 and the resistor 180). Therefore, an x-ray back-side illumination 480 will force the functional circuit 310 to a latchup condition.

FIG. 4B shows a circuit diagram of the functional circuit connected to the latchup sensitive diode circuit in accordance with aspects of the present disclosure. In FIG. 4B, the circuit 800 connects a functional circuit 310 (e.g., CMOS inverter) to a latchup sensitive diode circuit (e.g., the circuit 300 which includes the diode 170 and the resistor 180) using the parasitic bipolar PNP transistor 710. In particular, the circuit 300 includes the diode 170 which is connected between the resistor 180 and the bipolar junction transistor 470. The circuit 300 generates the charge under backside illumination (i.e., the x-ray back-side illumination 480) and the parasitic bipolar PNP transistor 710 uses this charge to induce a latchup condition in the functional circuit 310. The transistor 710 can also amplify this charge for higher sensitivity to backside attacks. In further embodiments, the parasitic bipolar PNP transistor 710 is formed using the p-substrate 495, the N-well 120b, and P+ region 140 (see FIG. 4A).

In FIG. 4B, the resistor 440 is connected between the power supply 160 (e.g., VDD) and the bipolar junction transistor 470. The bipolar junction transistor 460 has an emitter connected to the power supply 160 (e.g., VDD), a collector connected to the resistor 450, and a base connected to the bipolar junction transistor 470. The bipolar junction transistor 470 has an emitter connected to the ground 150, a collector connected to the bipolar junction transistor 460, and a base connected to the resistor 450. The resistor 450 is connected between the ground 150 and the bipolar junction transistor 470. The circuit 800 also includes the parasitic bipolar PNP transistor 710 which is between the bipolar junction transistor 460 and the resistor 450. The parasitic bipolar PNP transistor 710 is connected to the circuit 300 which includes the diode 170 and the resistor 180 through the connection 490 (see also FIG. 4A). The functional circuit 310 (e.g., CMOS inverter) comprises the resistors 440, 450 and the bipolar junction transistors 460, 470. Further, the x-ray back-side illumination 480 will force the functional circuit 310 to a latchup condition. In a specific embodiment, an e-fuse can be added to the power supply 160 (e.g., VDD) to turn-off the power supply under the latchup condition (see FIG. 6).

Figure 5:
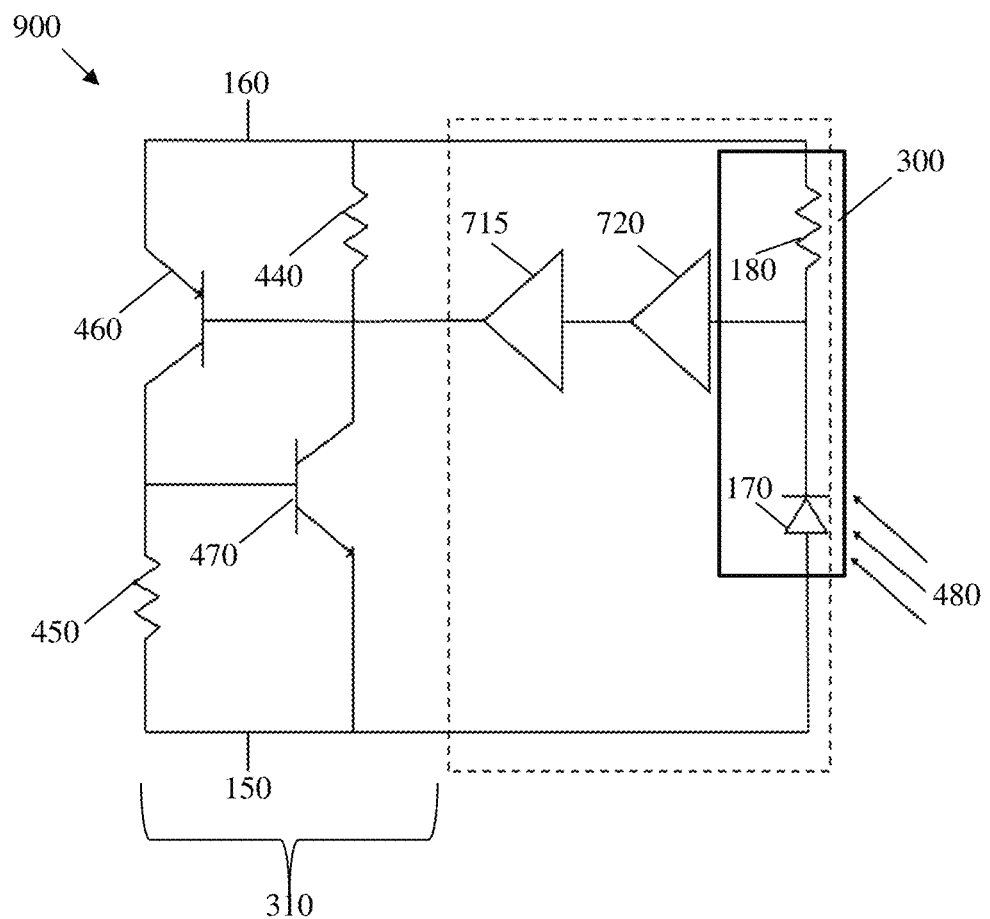
FIG. 5 shows a circuit diagram of a functional circuit connected to another latchup sensitive diode circuit in accordance with aspects of the present disclosure.

FIG. 5 shows a circuit diagram of the functional circuit connected to the latchup sensitive diode circuit in accordance with aspects of the present disclosure. In FIG. 5, the circuit 900 connects a functional circuit 310 (e.g., CMOS inverter) to a latchup sensitive diode circuit (e.g., the circuit 300 which includes the diode 170 and the resistor 180) using a pair of inverters 715, 720. In FIG. 5, the diode 170 is connected between the resistor 180 and the bipolar junction transistor 470. The circuit 300 generates the charge under backside illumination and the pair of inverters 715, 720 use this charge to induce latchup in the functional circuit 310.

FIG. 5 shows a pair of inverters 715 and 720 (instead of the parasitic bipolar PNP transistor as in FIG. 4A). In particular, the circuit 900 of FIG. 5 includes the pair of inverters 715, 720 which are between the bipolar junction transistor 460 and the resistor 180. The functional circuit 310 (e.g., CMOS inverter) comprises the resistors 440, 450 and the bipolar junction transistors 460, 470. Further, the x-ray back-side illumination 480 will force the functional circuit 310 to latchup. In a specific embodiment, an e-fuse can be added to the power supply 160 (e.g., VDD) to turn-off the power supply under the latchup condition (see FIG. 6).

Figure 6:
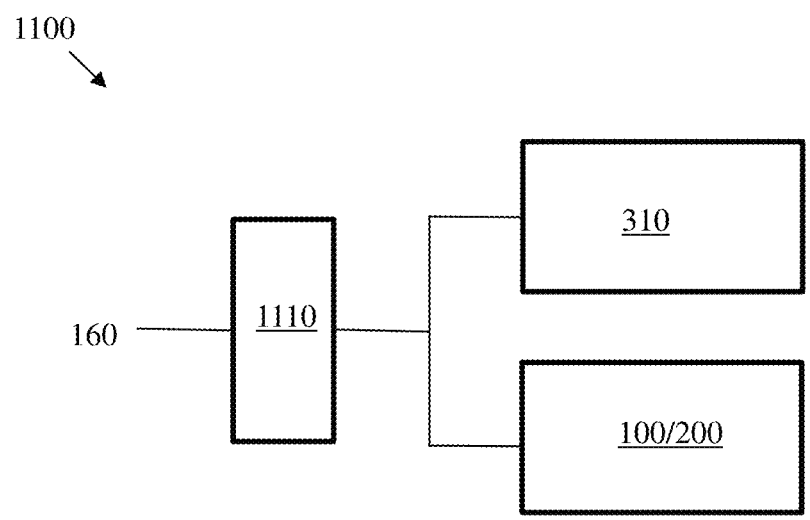
FIG. 6 shows a schematic diagram of an e-fuse with the functional circuit connected to the latchup sensitive diode circuit of FIGS. 1A-1C, in accordance with aspects of the present disclosure.

FIG. 6 shows a schematic diagram of an e-fuse with the functional circuit connected to the another latchup sensitive diode circuit of FIGS. 1A and 1B. In FIG. 6, a system 1100 includes an e-fuse circuit 1110 which can turn off the power supply 160 (e.g., VDD) to the functional circuit 310 and the P-N diode circuit 100/200 (i.e., the latchup sensitive diode circuit) in response to the latchup condition.

Figure 7:
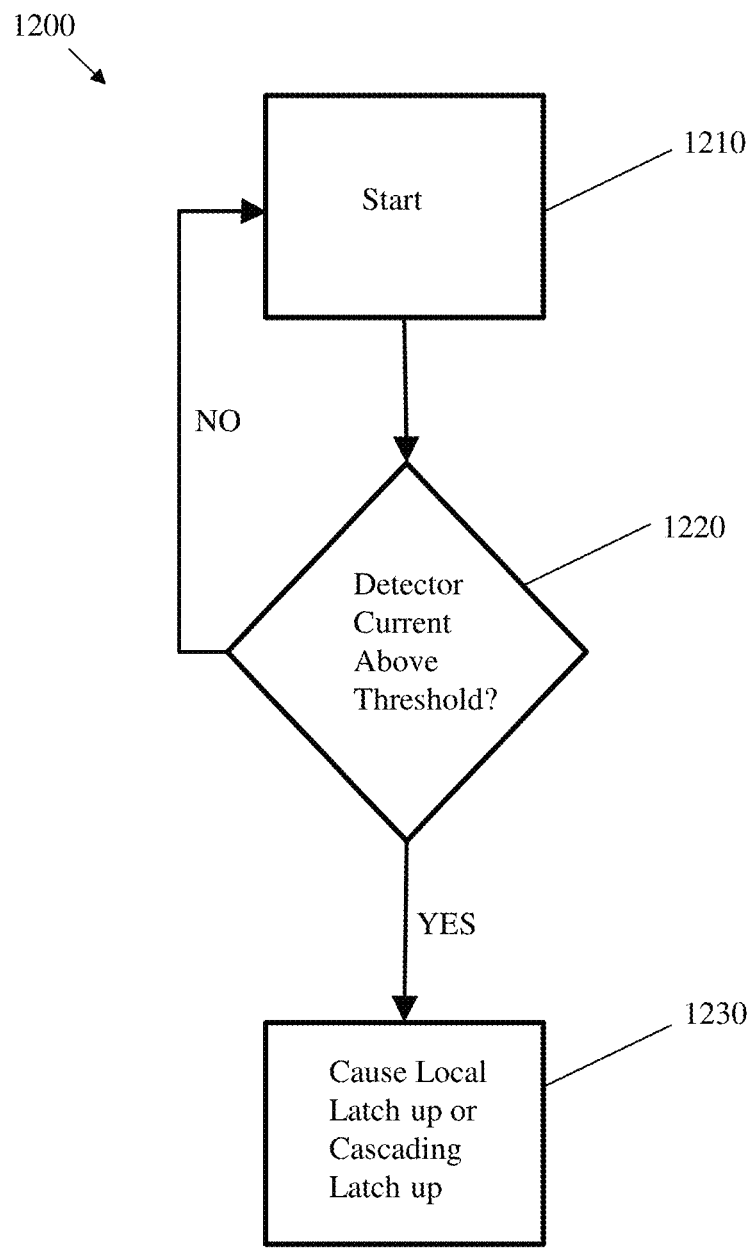
FIG. 7 shows a flowchart for the latchup sensitive diode circuits in accordance with aspects of the present disclosure.

FIG. 7 shows a flowchart for the latchup sensitive diode circuits in accordance with aspects of the present disclosure. In FIG. 7, the flowchart 1200 starts at step 1210. At step 1220, a detector will detect whether the current in a functional circuit 310 is above a predetermined threshold. If the current is not above the predetermined threshold (i.e., "NO" in step 1220), then the flowchart will loop back to step 1210. However, if the current is above the predetermined threshold (i.e., "YES" in step 1220), the flowchart will go to step 1230. At step 1230, the detector will cause a latchup condition to occur in a local area (e.g., in the functional circuit 310 or nearby circuits). In an alternative step of step 1230, the detector can cause a cascading latchup condition that will occur throughout an entire chip.

The circuit and the method of operation for an active x-ray attack preventing for secure integrated circuits of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and the method for an active x-ray attack preventing for secure integrated circuits of the present disclosure has been adopted from integrated circuit (IC) technology. For example, the structures are built on wafers and are realized in films of material patterned by photolithographic processes on the top of a wafer. In particular, the fabrication of the circuit and the method for an active x-ray attack preventing for secure integrated circuits uses three basic building blocks: (i) deposition of thin films of material on a substrate, (ii) applying a patterned mask on top of the films by photolithographic imaging, and (iii) etching the films selectively to the mask.

The active x-ray attack device can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as Smartphones) and edge computing markets. SoC is also commonly used in embedded systems and the Internet of Things.

The structures and methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a functional circuit; and
   at least one latchup sensitive diode circuit configured to induce a latchup condition in the functional circuit, placed in proximity of the functional circuit,
   wherein the at least one latchup sensitive diode circuit comprises a P-N diode circuit, and
   the P-N diode circuit comprises an N-well which includes an N+ region and a P+ region.

2. The structure of claim 1, wherein the functional circuit comprises a CMOS inverter.

3. A structure, comprising:
   a functional circuit; and
   at least one latchup sensitive diode circuit configured to induce a latchup condition in the functional circuit, placed in proximity of the functional circuit,
   wherein the at least one latchup sensitive diode circuit comprises a P-N diode circuit, and
   the P-N diode circuit comprises at least two N-wells with a first N-well including a N+ region and a P+ region and a second N-well including two N+ regions.

4. The structure of claim 3, wherein the N+ region of the first N-well is electrically connected to the N+ region of the second N-well.

5. The structure of claim 3, further comprising an e-fuse which turns off a power supply to the functional circuit in response to the latchup condition.

6. The structure of claim 1, wherein the P-N diode circuit induces the latchup condition in the functional circuit in response to an illumination of the P-N diode circuit from a backside of the structure.

7. The structure of claim 6, further comprising an e-fuse which turns off a power supply to the functional circuit in response to the latchup condition.

8. The structure of claim 1, wherein the P-N diode circuit is connected to a plurality of inverters.

9. The structure of claim 1, wherein the at least one latchup sensitive diode circuit is connected to a parasitic bipolar PNP transistor.

10. The structure of claim 1, wherein the at least one latchup sensitive diode circuit induces the latchup condition in the functional circuit in response to an illumination of the at least one sensitive diode circuit from a backside of the structure.

11. A structure, comprising:
    a plurality of functional circuits cascaded across a chip; and
    a plurality of latchup sensitive diode circuits which each comprise a P-N diode circuit to induce a cascading latchup condition and is cascaded in a predetermined proximity of the functional circuits across the chip,
    wherein the P-N diode circuit comprises an N-well which includes an N+ region and a P+ region.

12. The structure of claim 11, wherein each of the plurality of latchup sensitive diode circuits is connected to a plurality of inverters.

13. The structure of claim 12, wherein the plurality of latchup sensitive diode circuits induce the cascading latchup condition across the chip in response to an illumination of the plurality of latchup sensitive diode circuits from a backside of the structure.

14. The structure of claim 13, further comprising an e-fuse which turns off a power supply to the functional circuit in response to the latchup condition.

15. The structure of claim 11, wherein each of the plurality of latchup sensitive diode circuits is connected to a parasitic bipolar PNP transistor.

16. The structure of claim 15, wherein the plurality of latchup sensitive diode circuits induce the cascading latchup condition across the chip in response to an illumination of the plurality of latchup sensitive diode circuits from a backside of the structure.

17. The structure of claim 15, further comprising an e-fuse which turns off a power supply in response to the latchup condition.

* * * * *